(12) United States Patent
Wang et al.

(10) Patent No.: US 11,382,229 B2
(45) Date of Patent: Jul. 5, 2022

(54) CABLE MANAGER WITH FIXED AND REMOVABLE DOOR

(71) Applicant: Leviton Manufacturing Co., Inc., Melville, NY (US)

(72) Inventors: Hua Wang, Mill Creek, WA (US); Tony Yuen, Bellevue, WA (US); Sean McCloud, Bothell, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 0 days.

(21) Appl. No.: 17/076,093

(22) Filed: Oct. 21, 2020

(65) Prior Publication Data

US 2021/0127515 A1    Apr. 29, 2021

Related U.S. Application Data

(60) Provisional application No. 62/925,435, filed on Oct. 24, 2019.

(51) Int. Cl.
*H05K 5/02* (2006.01)
*H05K 7/14* (2006.01)

(52) U.S. Cl.
CPC ......... *H05K 5/0247* (2013.01); *H05K 5/0221* (2013.01); *H05K 5/0226* (2013.01); *H05K 7/1491* (2013.01)

(58) Field of Classification Search
None
See application file for complete search history.

(56) References Cited

U.S. PATENT DOCUMENTS

| | | | | |
|---|---|---|---|---|
| 4,665,585 A | * | 5/1987 | Westin | E04F 10/04 16/266 |
| D365,221 S | * | 12/1995 | Erickson | D6/300 |
| 5,886,868 A | * | 3/1999 | White | H02B 1/44 361/652 |
| 5,991,975 A | * | 11/1999 | Baer | E05D 7/009 16/250 |
| 7,178,292 B2 | * | 2/2007 | Yamada | E05D 15/502 16/229 |
| 7,417,188 B2 | | 8/2008 | McNutt et al. | |
| 7,510,421 B2 | * | 3/2009 | Fransen | H01R 9/2416 439/449 |
| 7,536,752 B2 | | 5/2009 | Laursen | |
| 7,757,349 B2 | | 7/2010 | Laursen | |
| 8,024,839 B2 | * | 9/2011 | Lewis, II | E05D 11/105 16/266 |
| 8,526,774 B2 | * | 9/2013 | Krampotich | G02B 6/4453 385/135 |
| 8,872,030 B2 | * | 10/2014 | McNeal | H04Q 1/02 174/101 |
| 8,887,354 B1 | * | 11/2014 | Weinman | E05D 7/12 16/252 |

(Continued)

*Primary Examiner* — Xanthia C Cunningham
(74) *Attorney, Agent, or Firm* — Amin, Turocy & Watson, LLP

(57) ABSTRACT

A cable management device comprises cable management tray with a door that is connected to the cable management tray by a hinge, allowing the door to be opened without removing the door from the tray, and which also permits the door to be easily disengaged from the tray using a simple manual interaction that can be performed even if visibility to the hinge is limited.

20 Claims, 17 Drawing Sheets

(56) References Cited

U.S. PATENT DOCUMENTS

| | | | | |
|---|---|---|---|---|
| 8,931,742 | B2* | 1/2015 | Gong | H05K 7/1491 |
| | | | | 248/49 |
| 9,055,689 | B2* | 6/2015 | Yu | H05K 7/1487 |
| 9,307,683 | B2* | 4/2016 | Mortensen | G11B 33/1493 |
| 9,429,251 | B1* | 8/2016 | Lin | H04Q 1/06 |
| 9,482,267 | B1* | 11/2016 | Stratman | E05D 7/00 |
| 10,590,687 | B1* | 3/2020 | Citers | E05D 7/1061 |
| 10,624,223 | B1* | 4/2020 | Tsorng | H05K 5/03 |
| 10,736,230 | B2* | 8/2020 | Chen | H05K 7/1489 |
| 10,952,345 | B2* | 3/2021 | Gupta | H05K 7/1491 |
| 2002/0019151 | A1* | 2/2002 | Lin | H01R 9/2416 |
| | | | | 439/49 |
| 2005/0193521 | A1* | 9/2005 | Heid | E05D 7/12 |
| | | | | 16/271 |
| 2006/0162948 | A1* | 7/2006 | Rinderer | H05K 7/186 |
| | | | | 174/50 |
| 2008/0093120 | A1* | 4/2008 | Nakayama | H05K 7/1448 |
| | | | | 174/480 |
| 2008/0307615 | A1* | 12/2008 | Hein | B42F 9/00 |
| | | | | 24/455 |
| 2009/0245746 | A1* | 10/2009 | Krampotich | G02B 6/4455 |
| | | | | 385/135 |
| 2010/0007252 | A1* | 1/2010 | Liu | H05K 7/1487 |
| | | | | 312/223.2 |
| 2010/0130094 | A1* | 5/2010 | Michalk | E04C 2/08 |
| | | | | 446/111 |
| 2011/0047877 | A1* | 3/2011 | Hellinga | E05D 15/24 |
| | | | | 49/199 |
| 2017/0208698 | A1* | 7/2017 | De Vis | G02B 6/4452 |
| 2017/0280581 | A1* | 9/2017 | Hesse | H05K 7/1487 |
| 2017/0290192 | A1* | 10/2017 | Goergen | G02B 6/4453 |
| 2019/0056560 | A1* | 2/2019 | Franzke | G02B 6/4452 |

* cited by examiner

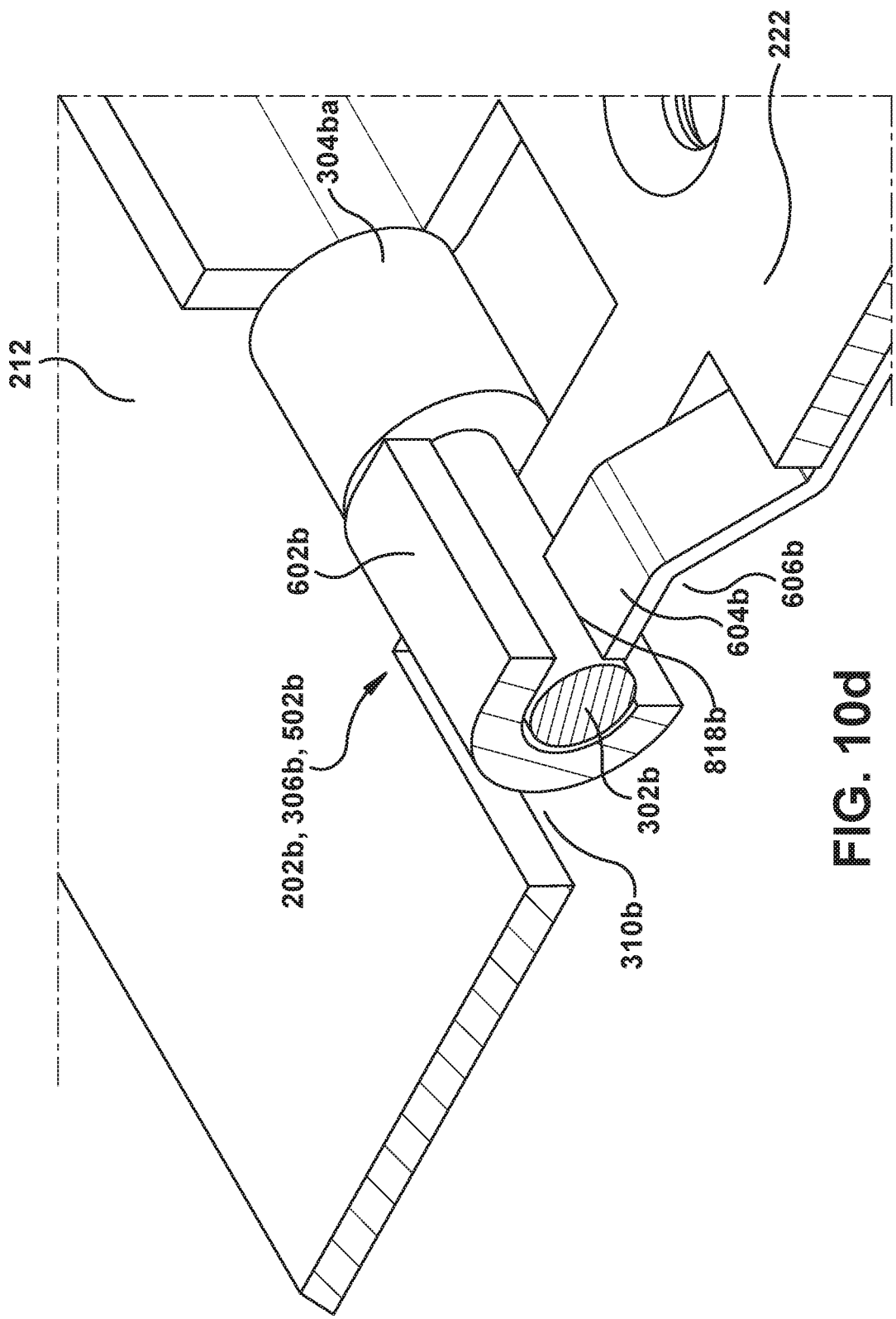

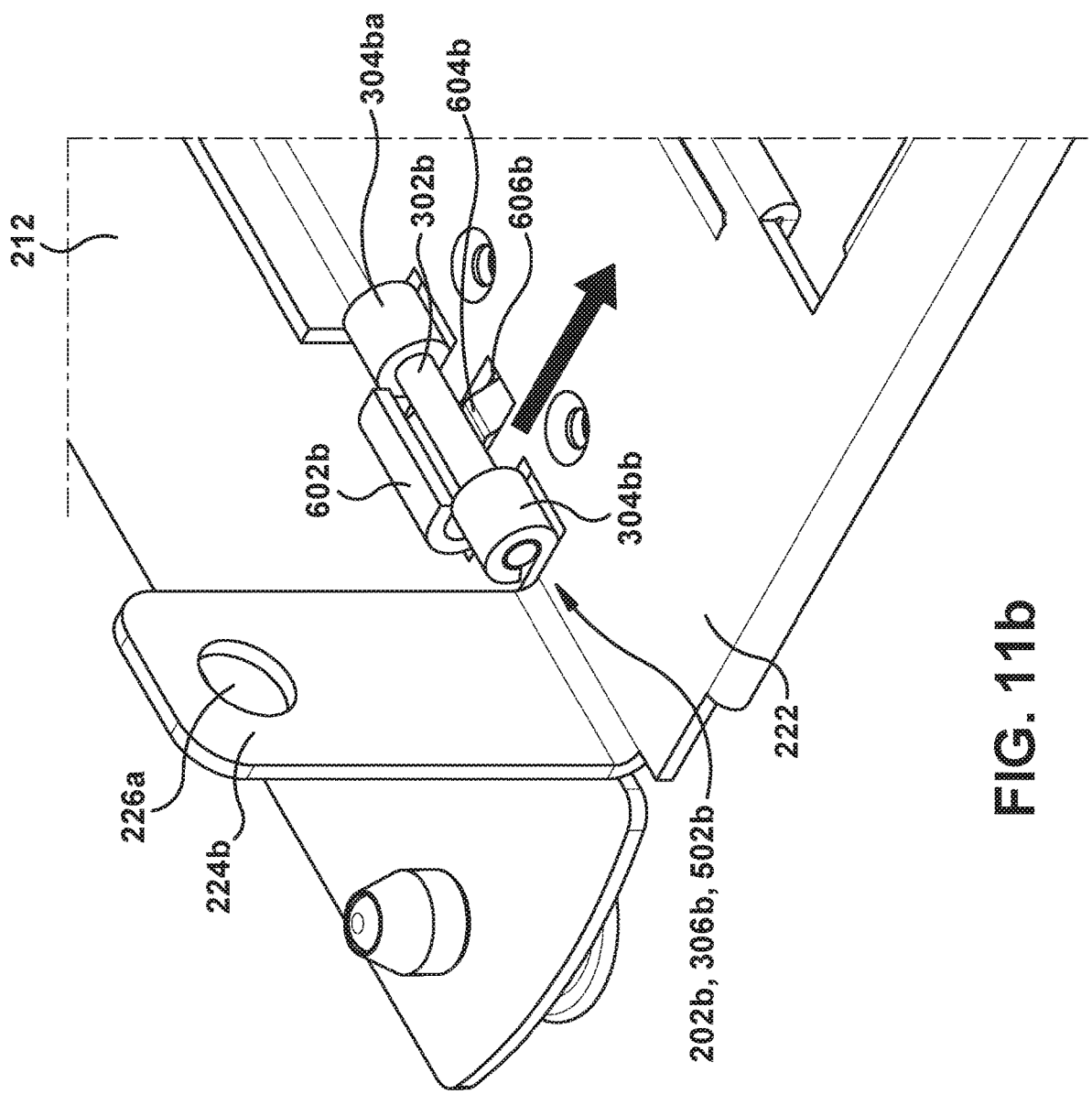

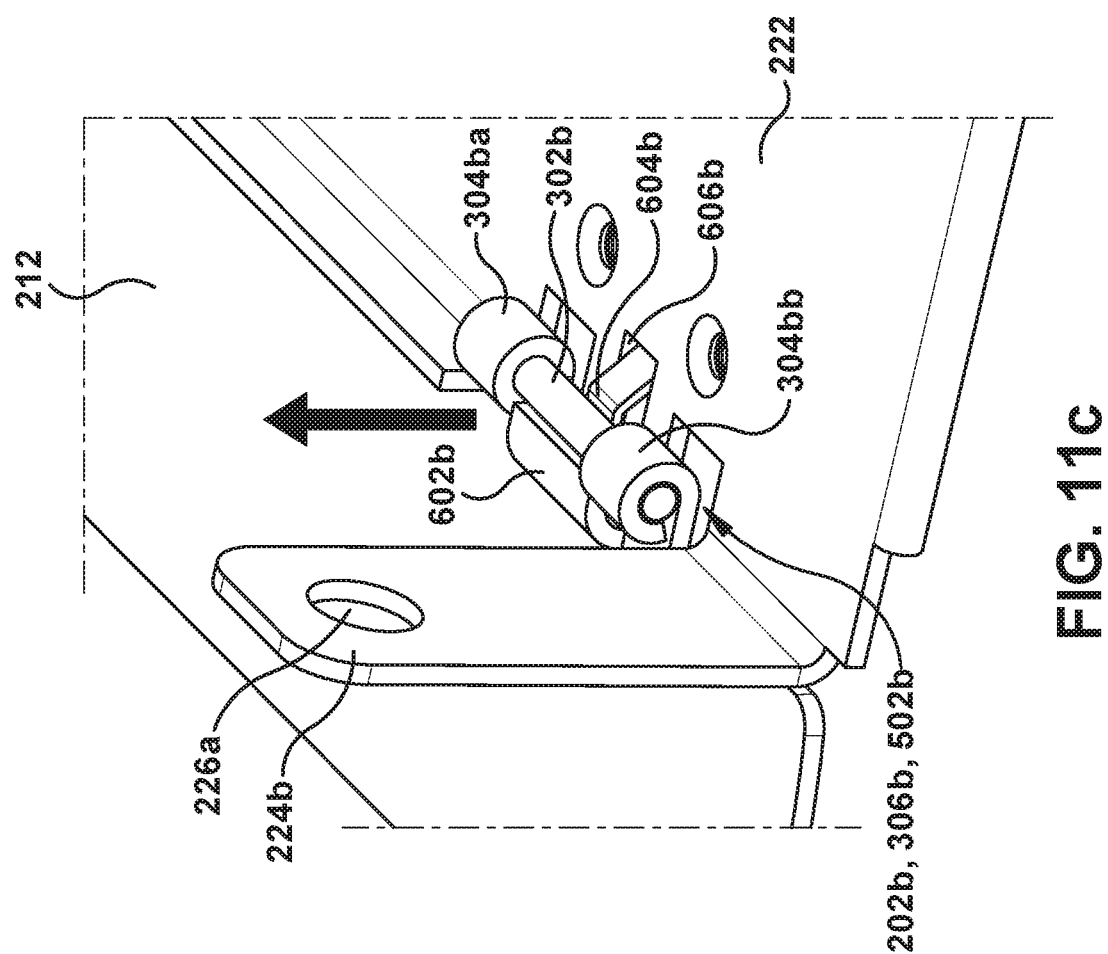

US 11,382,229 B2

CABLE MANAGER WITH FIXED AND REMOVABLE DOOR

CROSS-REFERENCE TO RELATED APPLICATIONS

This application claims priority to U.S. Provisional Patent Application Ser. No. 62/925,435, filed on Oct. 24, 2019, and entitled "CABLE MANAGER WITH FIXED AND REMOVABLE DOOR," the entirety of which is incorporated by reference.

TECHNICAL FIELD

The disclosed subject matter relates generally to cable management systems for electrical enclosures and cabinets

BACKGROUND

Cable management trays are often used to organize wiring harnesses or cable bundles within an electrical enclosure or panel. These trays comprise retaining structures that tightly consolidate multiple wires or cables and serve as guides for neatly routing these conductors in an organized manner.

It is sometimes necessary to access the wiring held by a cable management tray. However, in some types of installations, the design of conventional cable management trays renders access to the wiring therein difficult.

The above-described deficiencies of cable management trays are merely intended to provide an overview of some of the problems of current technology, and are not intended to be exhaustive. Other problems with the state of the art, and corresponding benefits of some of the various non-limiting embodiments described herein, may become further apparent upon review of the following detailed description.

SUMMARY

The following presents a simplified summary of the disclosed subject matter in order to provide a basic understanding of some aspects of the various embodiments. This summary is not an extensive overview of the various embodiments. It is intended neither to identify key or critical elements of the various embodiments nor to delineate the scope of the various embodiments. Its sole purpose is to present some concepts of the disclosure in a streamlined form as a prelude to the more detailed description that is presented later.

Various embodiments described herein relate to a cable management device comprising a cable management tray and an associated door that permits access to wiring bundles mounted on the tray. The door is attached to the tray using a hinge assembly that permits the door to be opened without removing the door from the tray, and which also facilitates fast and easy removal, as well as reattachment, of the door from the tray even if visibility to the tray is blocked or limited.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the drawings. It will also be appreciated that the detailed description may include additional or alternative embodiments beyond those described in this summary.

BRIEF DESCRIPTION OF DRAWINGS

FIG. 10d is a close-up cross-sectional view of the hinge assembly illustrating engagement of the door with the cable management tray.

FIG. 11b is a close-up view of the hinge assembly illustrating a second step of the sequence for disengaging the door from its cable management tray.

FIG. 11c is a close-up view of the hinge assembly illustrating a third step of the sequence for disengaging the door from its cable management tray.

DETAILED DESCRIPTION

Figure 1:
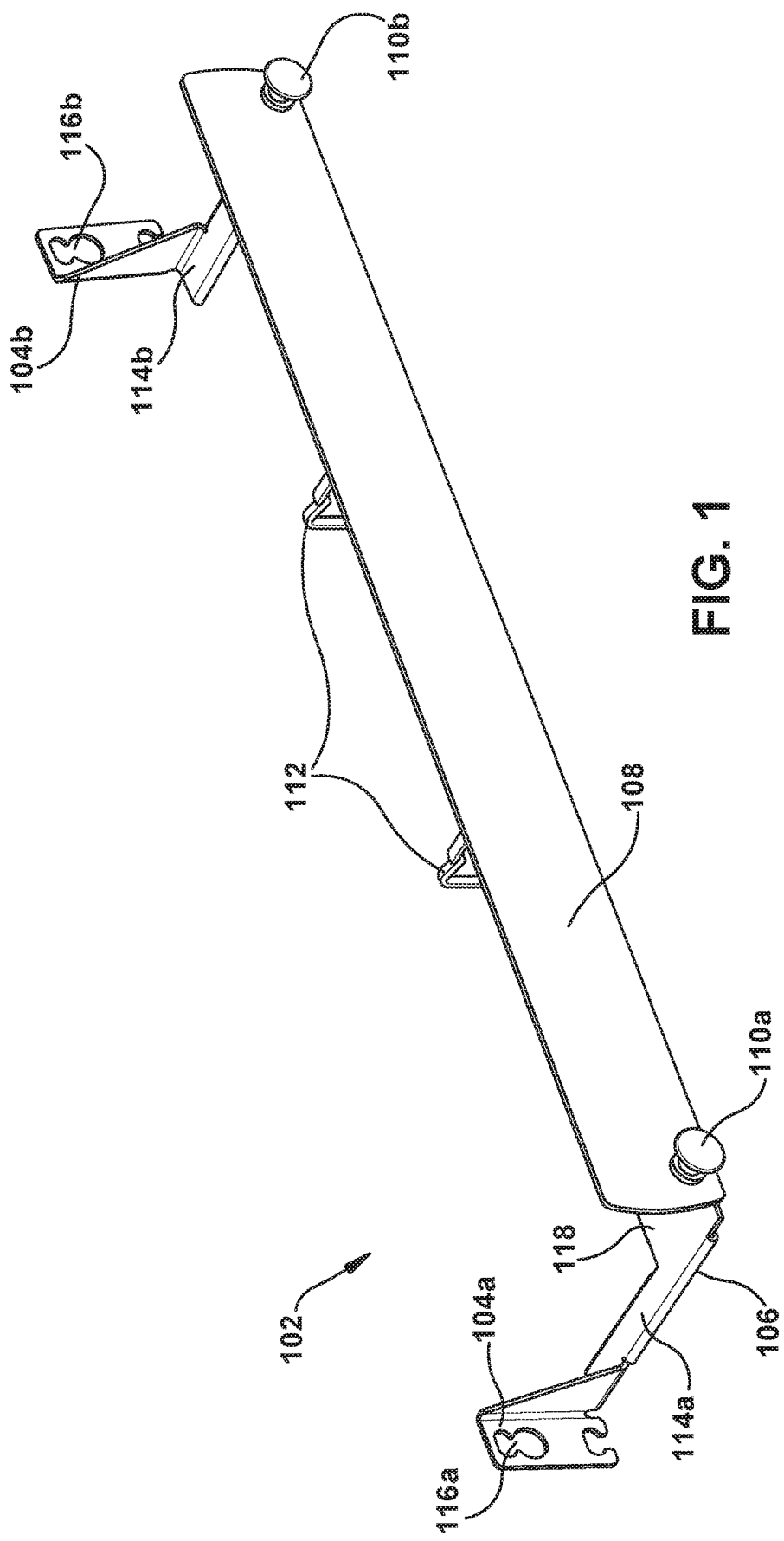
FIG. 1 is a perspective view of an example cable management device comprising a cable management tray and a front-mounted door.

The subject disclosure is now described with reference to the drawings wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Some reference numbers used herein to label illustrated components are suffixed with letters to delineate different instances of a same or similar component. In general, if a reference number without an appended letter is used within this disclosure, the descriptions ascribed to the reference number are to be understood to be applicable to all instances of that reference number with or without an appended letter unless described otherwise.

FIG. 1 is a perspective view of an example cable management device 102 comprising a cable management tray 106 and a front-mounted door 108. This cable management device 102 is configured to mount to the front of, or within, an electrical enclosure or panel. The tray 106 comprises a flat elongated plate 118 with two arms 114a and 114b extending rearward from the two ends of the plate 118 at right angles to the plate's lengthwise axis. Mounting brackets 104a and 104b with mounting holes 116a and 116b formed therein are formed on the ends of the arms 114a and 114b, and are used to mount the cable management device 102 to an enclosure or panel. One or more cable management loops 112 are mounted on a top surface of plate 118 and are designed to hold wiring or cable bundles on the tray 106.

Door 108 is mounted on a front edge of the tray 106. In an example design, door 108 may be fastened to two upright brackets on the front edge of tray 106 (not visible in FIG. 1) using two fasteners 110a and 110b near the respective two ends of the door 108 (e.g., plunger latches, screws, bolts, etc.). Door 108 can be unfastened from the tray 106 by unfastening the fasteners 110a and 110b, thereby permitting the door 108 to pivot within a 180° angle about the front edge of the tray 106, providing access to the wiring or cable harness mounted on the tray 106.

In some installation environments, such as data centers comprising tall server racks or other types of tall or stacked enclosures, cable management trays may be installed above eye level. A user wishing to access a wiring harness mounted on a tray that has been installed above eye level may be forced to unfasten the fasteners 110a and 110b blindly, rendering unfastening of the door 108 difficult. Moreover, a user may wish even greater access to a wiring harness mounted on a tray that is possible only by complete removal of the door 108 from the tray 106 in order to access the wiring. Complete removal of the door 108 from the tray 106, of course, creates a risk that the door 108 may be misplaced.

To address these and other issues, one or more embodiments described herein provide a cable management device comprising a door that is connected to a cable management tray by a hinge assembly, allowing the door to be opened by pivoting about the hinge assembly, and without removing the door from the tray. Alternatively, the hinge assembly also permits the door to be easily disengaged and completely removed from the tray entirely if desired, using a simple manual interaction effected by a spring device that can be performed even if visibility to the cable management device is limited.

Figure 2A:
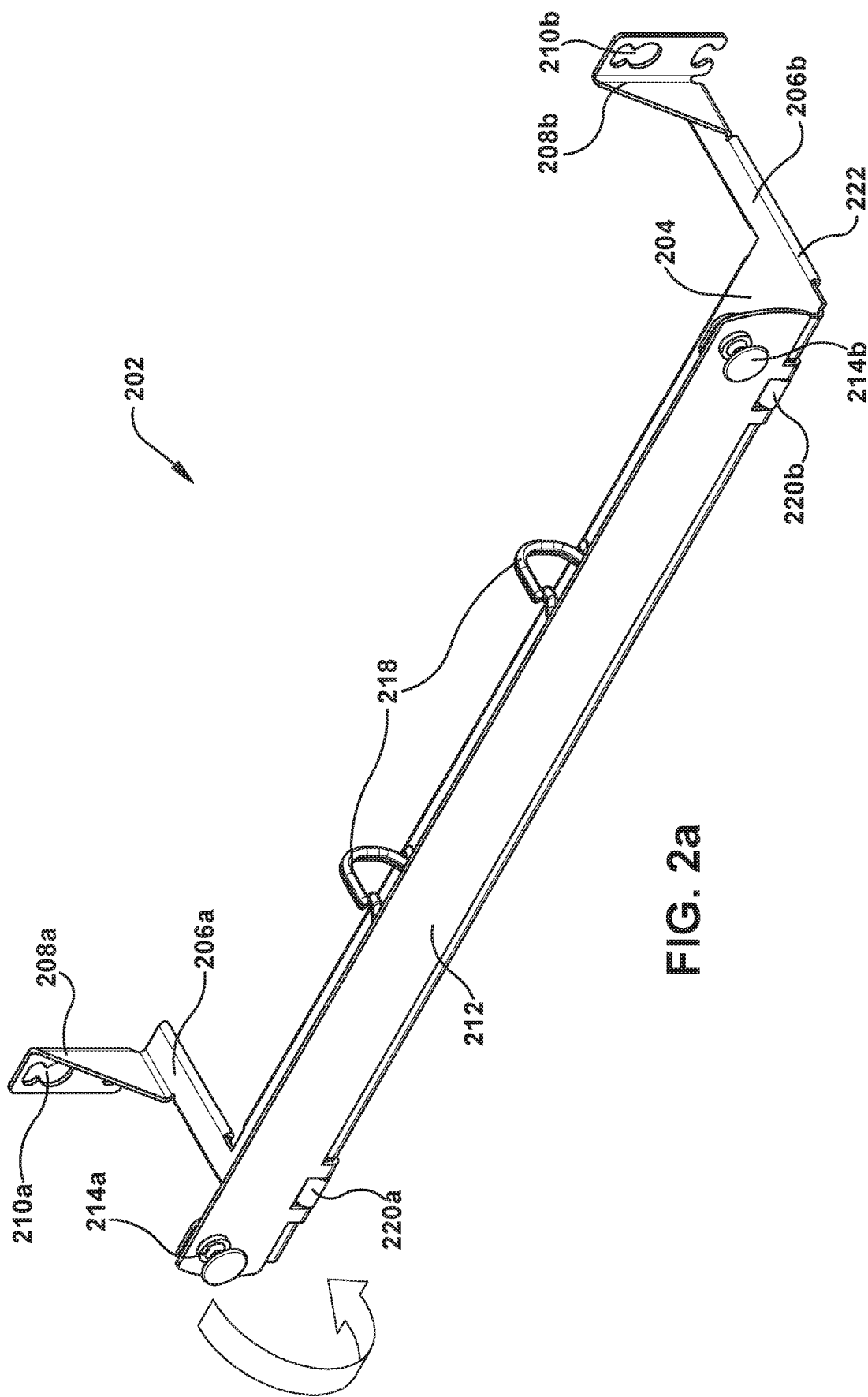
FIG. 2a is a perspective view of an example cable management device with an associated door in the closed position.
Figure 2B:
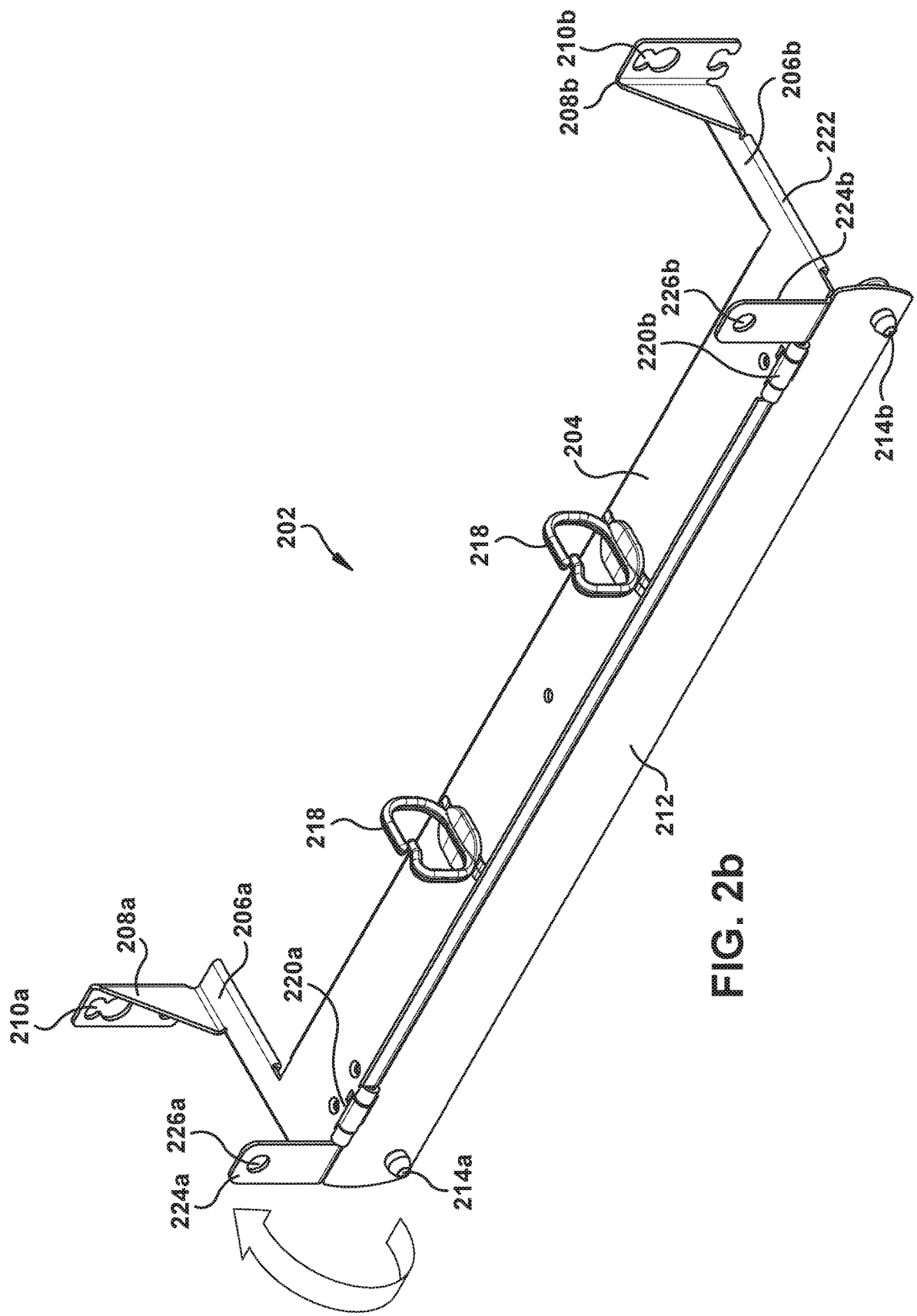
FIG. 2b is a perspective view of the example cable management device with the associated door in the opened position.

FIGS. 2a and 2b are perspective views of an example cable management device 202 according to one or more embodiments. Cable management device 202 comprises a tray 222 on which a door 212 is attached by two hinge assemblies 220a and 220b located near the respective two ends of the door 212. FIG. 2a depicts the door 212 in the closed position, and FIG. 2b depicts door 212 in the open position. Tray 222 comprises a flat elongated plate 204 with two arms 206a and 206b extending rearward from respective two ends of the elongated plate 204 at substantially right angles to the lengthwise axis of the plate 204. Mounting brackets 208a and 208b having respective mounting holes 210a and 210b formed therein are formed on the ends of the two arms 206a and 206b, respectively. These mounting brackets 208a, 208b can be used to mount the cable management device 202 to an enclosure or panel. One or more cable management loops 218 are mounted on a top surface of the tray 222 and can be used to hold wiring or cable bundles to the tray 222.

Two upright brackets 224a and 224b (see FIG. 2b) are formed on the front edge of elongated plate 204 located at the respective two ends of the plate 204. In the illustrated example, latching holes 226a and 226b are formed through the brackets 224a and 224b, respectively, and are configured to receive and hold corresponding latching mechanisms 214a and 214b installed near the respective two ends of door 212 while the door 212 is in the closed position. Latching mechanism 214a, 214b may comprise, for example, plunger-type latches, screws, clips, or other such mechanisms for fastening the door 212 in the closed position while also permitting the door 212 to be unfastened and pivoted about hinge assemblies 220a, 220b from the closed position (depicted in FIG. 2a) to the opened position (depicted in FIG. 2b).

In some embodiments, latching holes 226a, 226b and latching mechanisms 214a, 214b can be replaced with magnetic latches. In such embodiments, door-mounted magnets may be mounted on the inside surface of the door 212 such that a first magnetic polarity faces toward the upright brackets 224a, 224b while the door 212 is in the closed position, and bracket-mounted magnets may be mounted on the upright brackets 224a, 224b such that a second magnetic polarity—opposite the first polarity—faces toward the door-mounted magnets. In this way, the magnetic attraction between the door-mounted magnets and bracket-mounted magnets fastens the door 212 in the closed position when the door 212 is pivoted about the hinge assemblies 220a, 220b to the closed position.

Hinge assemblies 220a, 220b are located along the interface between the bottom edge of door 212 and the front edge of tray 222, such that the door 212 can be opened by releasing the latching mechanisms 214a, 214b from upright brackets 224a, 224b and pivoting the door downward about hinge assemblies 220a, 220b, thereby providing access to wiring harnesses held on the tray 222 by cable management loops 218.

Figure 3:
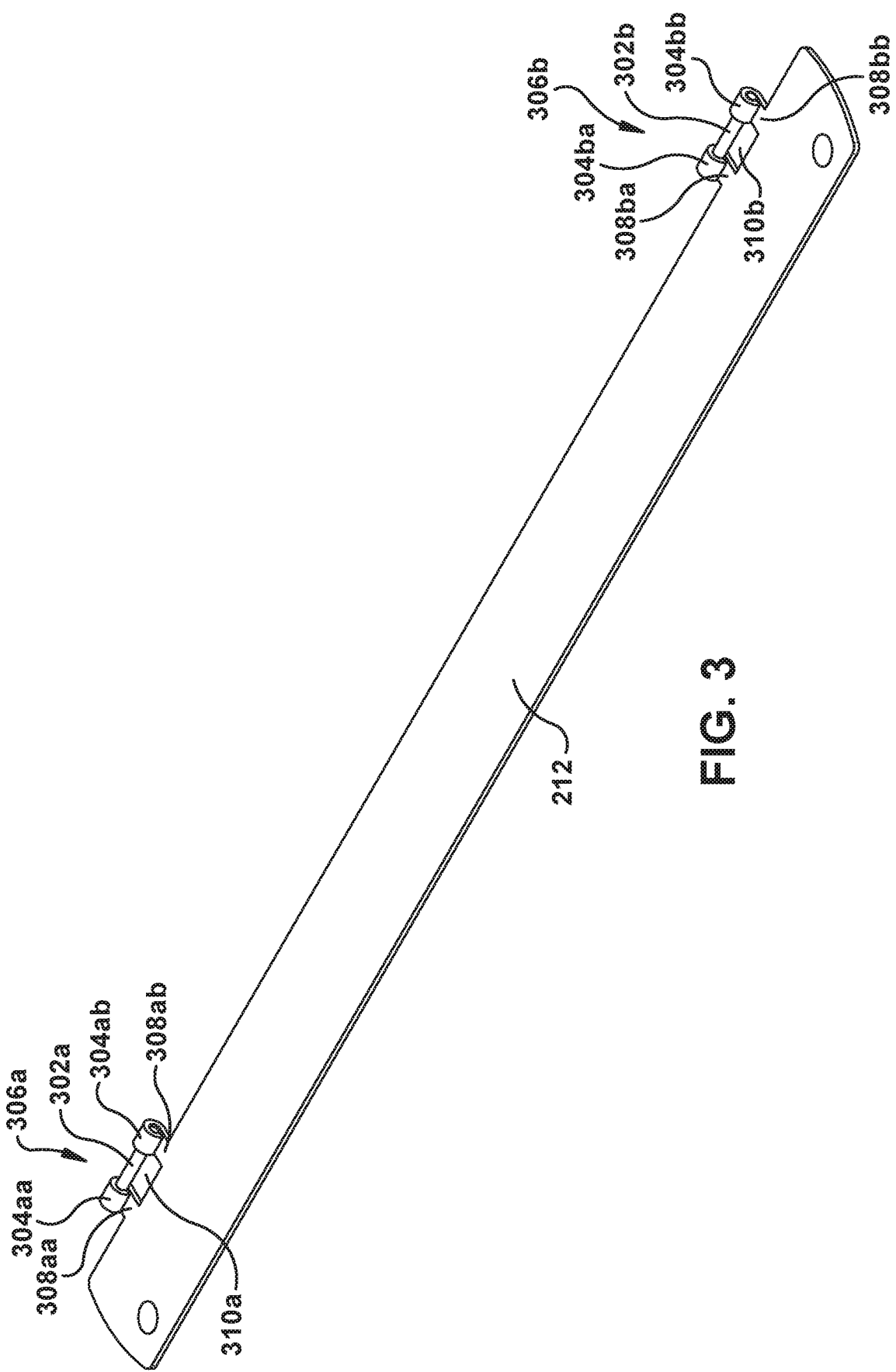
FIG. 3 is a perspective view of a door that includes door-side hinge sub-assemblies for attaching the door to a cable management tray.
Figure 4:
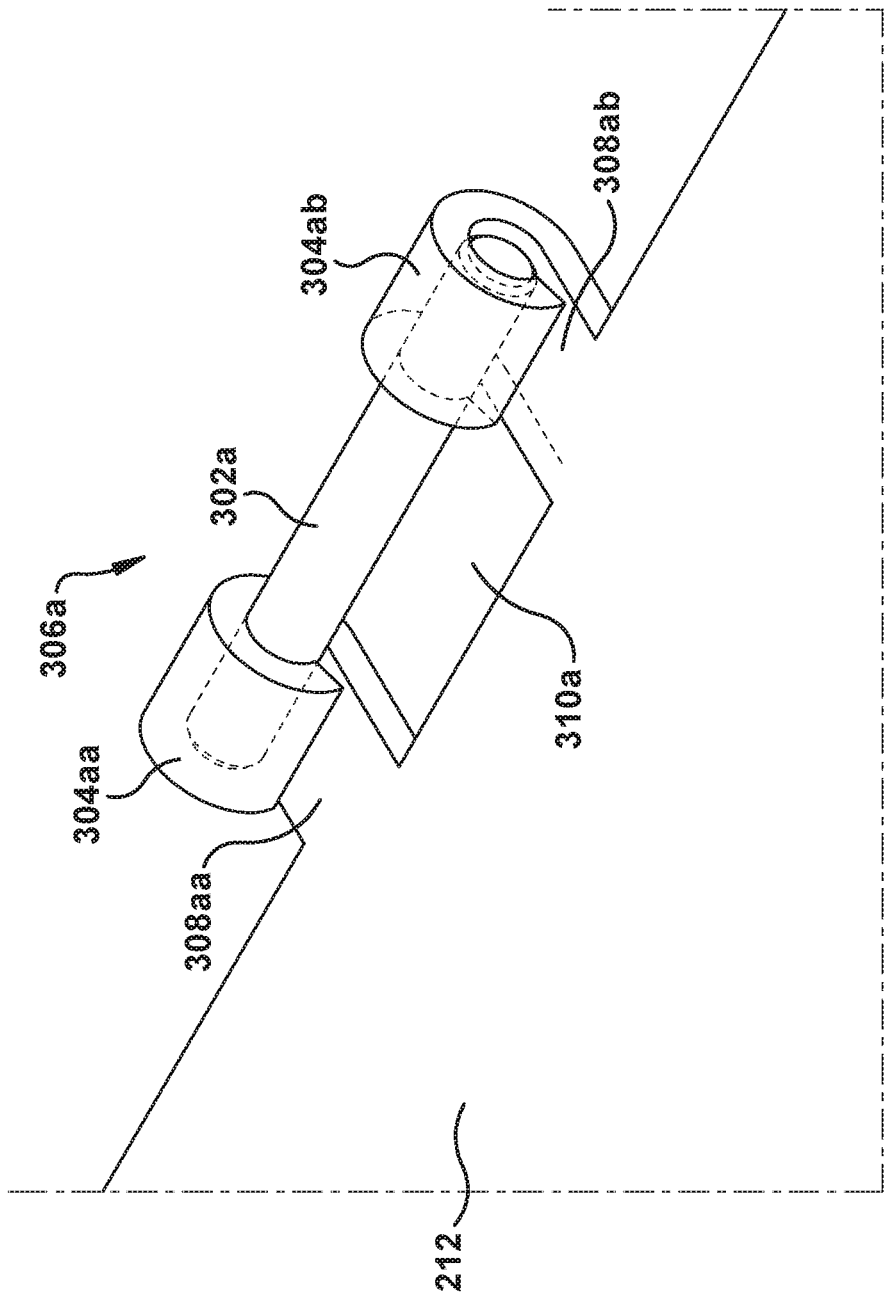
FIG. 4 is a close-up view of a door-side hinge sub-assembly for attaching a door to a cable management tray.

Hinge assemblies 220a, 220b each comprise a door-side hinge sub-assembly and a tray-side hinge sub-assembly that can easily be connected to or disengaged from one another. FIG. 3 is a perspective view of door 212 that allows the door-side hinge sub-assemblies 306a and 306b to be seen more clearly. FIG. 4 is a close-up view of one of the door-side hinge sub-assemblies 306a (the other door-side hinge sub-assembly 306b is substantially identical to sub-assembly 306a). Each door-side hinge sub-assembly 306a, 306b comprises a dowel pin 302a, 302b held between two dowel sleeves 304 (dowel sleeves 304aa and 304ab hold dowel pin 302a, while dowel sleeves 304ba and 304bb hold dowel pin 302b). Each dowel sleeve 304 is formed on the end of an offset arm 308 that extends from the bottom edge of door 212, such that when the dowel pin 302 is held between the two dowel sleeves 304a, 304b, the dowel pin 302 traverses a gap 310 formed between the two sleeves 304a, 304b. As shown in FIGS. 3 and 4, dowel sleeves 304aa, 304ab, 304ba, and 304bb are held by offset arms 308aa, 308ab, 308ba, and 308bb, respectively. Gap 310a is defined by offset arms 308aa and 308ab, and gap 310b is defined by offset arms 308ba and 308bb.

Figure 5:
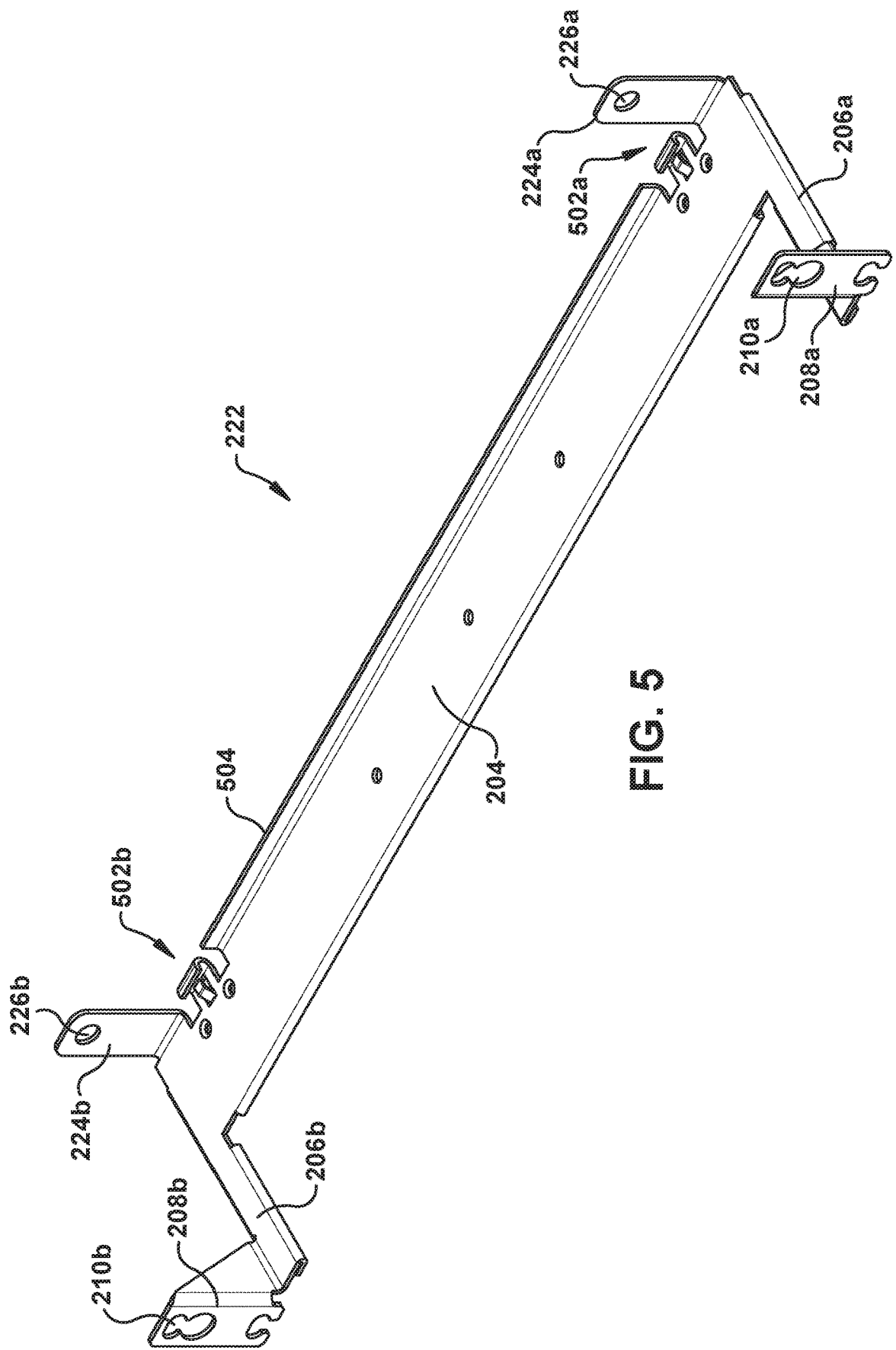
FIG. 5 is a perspective view of a cable management tray with its removable door removed.
Figure 6:
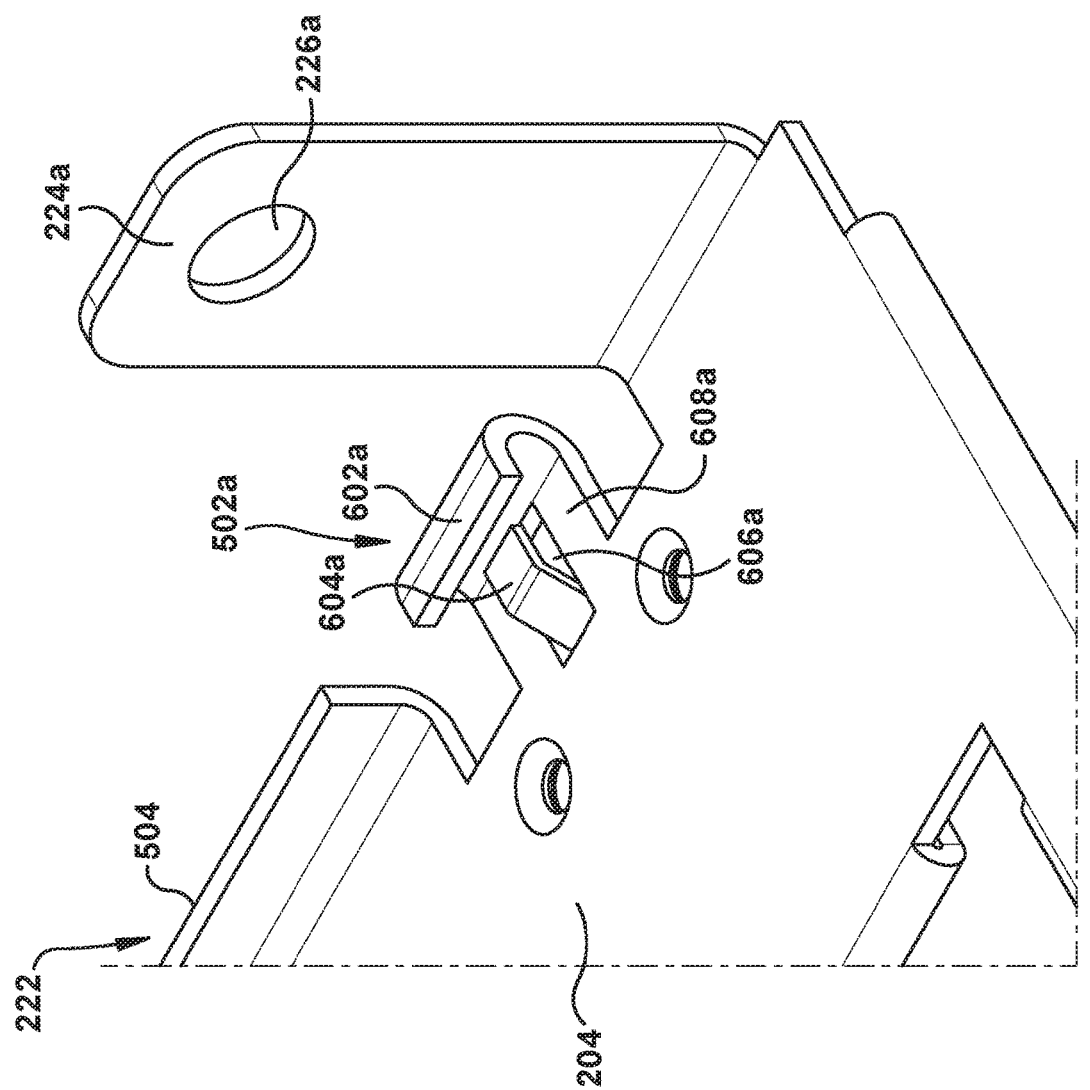
FIG. 6 is a close-up top view of a tray-side hinge sub-assembly of a cable management tray.
Figure 7:
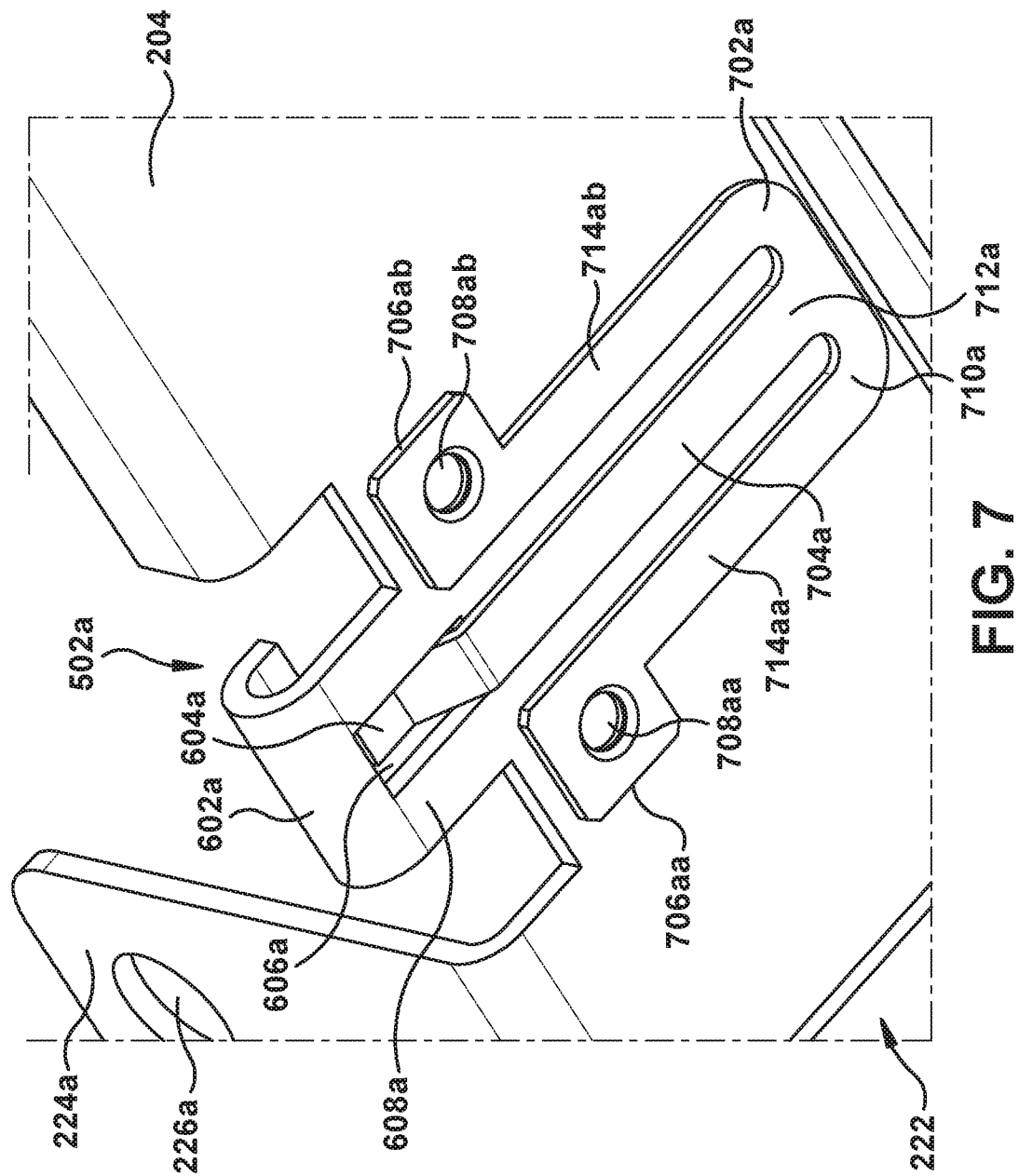
FIG. 7 is a close-up bottom view of the tray-side hinge sub-assembly of a cable management tray.

FIG. 5 is a perspective view of tray 222 with the door 212 removed and rotated relative to the views depicted in FIGS. 2a and 2b to allow the tray-side hinge sub-assemblies 502a and 502b to be seen. FIG. 6 is a close-up top view of tray-side hinge sub-assembly 502a that affords a closer view of the components of the tray-side hinge sub-assembly 502a (sub-assembly 502b is substantially identical to sub-assembly 502a), and FIG. 7 is a close-up bottom view of the sub-assembly 502a. Tray-side hinge sub-assemblies 502a, 502b are located along the front edge 504 of tray 222 such that the tray-side hinge sub-assemblies 502a, 502b align with the door-side hinge sub-assemblies 306a, 306b (see FIGS. 3, 4) when the door 212 is mated with the tray 222. As can be seen in FIG. 6 tray-side hinge sub-assembly 502a (and similarly tray-side hinge sub-assembly 502b) comprises a hinge arm 608a that extends from the front edge 504 of tray 222 and that terminates in a hinge sleeve 602a formed by curling the end of the hinge arm 608a, yielding a U-shaped profile whose open side faces backward toward the rear of the tray 222. The open side of hinge-sleeve 602a is configured to receive the dowel pin 302a of the corresponding door-side hinge sub-assembly 306a when the door 212 is mated with the tray 222.

Figure 8:
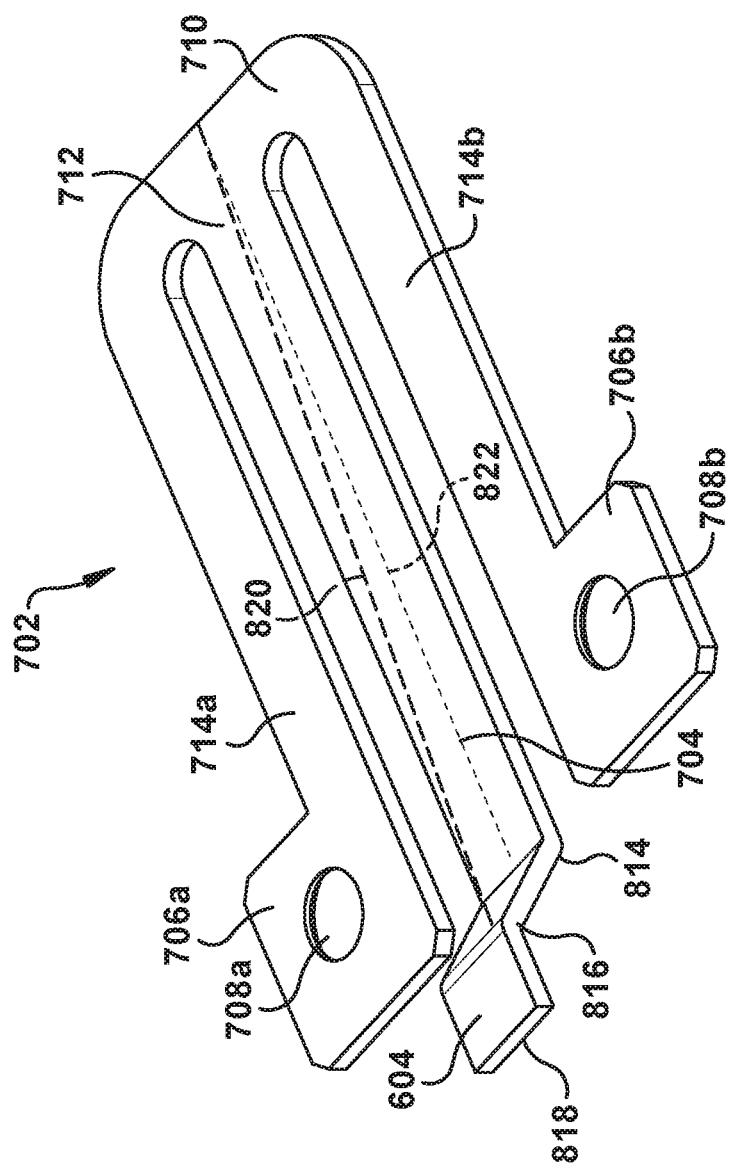
FIG. 8 is a perspective view of a locking spring of a cable management tray.

A rectangular opening 606a is formed in the hinge arm 608a of the tray-side hinge sub-assembly 502a (and similarly tray-side hinge sub-assembly 502b). An engagement tab 604a of a locking spring 702a (see FIGS. 7, 8) protrudes through this opening 606a. As can be seen in FIG. 7, locking spring 702a is mounted on the bottom surface of the tray 222. FIG. 8 is a perspective view of the locking spring 702 in isolation according to one or more embodiments (it is to be understood that the illustrated embodiment of cable management device 202 comprises two instances of locking spring 702—referenced as 702a and 702b—respectively corresponding to the two tray-side hinge sub-assemblies 502a and 502b). In the illustrated example, locking spring 702 comprises a flat base section 710 along its rear side, from which two flat mounting arms 714a and 714b and a cantilevered locking tongue 704 extend such that the locking tongue 704 is located between the two mounting arms 714a and 714b. Each of the two mounting arms 714a, 714b terminates in a mounting bracket 706a, 706b through which a mounting hole 708a, 708b is formed. These mounting holes 708a and 708b can be used to rivet or otherwise fasten the locking spring 702 against the bottom surface of the tray 222, as shown in FIG. 7.

Although FIG. 7 depicts locking spring 702 as being mounted to the bottom surface of tray 222, the locking spring 702 may alternatively be mounted to the top surface of the tray 222 in some embodiments. Also, in some embodiments of locking spring 702, the mounting arms 714a and 714 can be omitted, such that the locking spring 702 comprises only locking tongue 704 modified such that its base (at or near location 712) is riveted or otherwise fastened to the tray 222.

Locking tongue 704 extends from the base section 710 and runs between the two mounting arms 714a and 714b. Locking tongue 704 terminates in a raised engagement tab 604 formed by creating two bends near the front end of the locking tongue 704—a first upward bend 814 at a first distance from the leading edge 818 of the locking tongue 704, and a second downward bend 816 at a second distance from the leading edge 818 shorter than the first distance. The first and second bends 814 and 816 are angled such that the surface of the raised engagement tab 604a is substantially parallel with the surface of the main body of the locking tongue 704a, but elevated relative to the main body.

As can be seen in FIGS. 6 and 7, when the locking spring 702a is mounted to the bottom surface of the tray 222 using mounting holes 708aa and 708ab, the engagement tab 604a on the end of the locking tongue 704a protrudes through the rectangular opening 606a of the hinge arm 608a of the tray-side hinge sub-assembly 502a, with the leading edge 818a of the engagement tab 604a facing toward the open side of the U-shaped profile of the hinge sleeve 602a. By this orientation, the leading edge 818a of the engagement tab 604a holds the dowel pin 302a of the door-side hinge sub-assembly 306a in place within the hinge sleeve 602a when the door-side hinge sub-assembly 306a is engaged with the tray-side hinge sub-assembly 502a, as will be described in more detail below.

Figure 9:
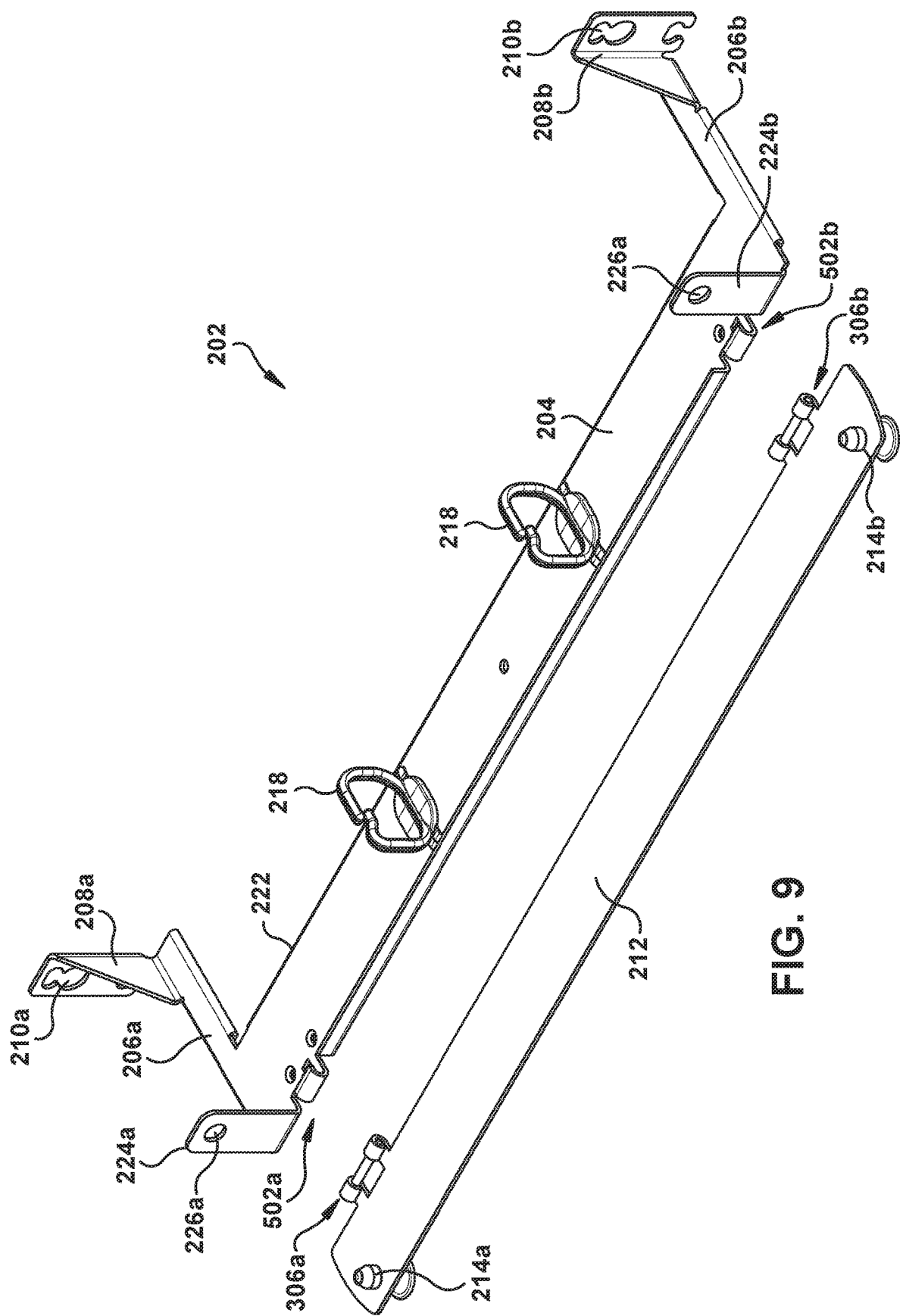
FIG. 9 is a perspective view of a cable management device depicting its associated door disengaged from the tray.

FIG. 9 is a perspective view of the cable management device 202 depicting the door 212 disengaged from the tray 222. The door 212 can be easily connected to the tray 222—yielding the assembled cable management device 202 with hinged door 212 depicted in FIGS. 2a and 2b—by engaging the two door-side hinge sub-assemblies 306a and 306b with the corresponding tray-side hinge sub-assemblies 502a and 502b. FIGS. 10a-10d are close-up views of hinge assembly 220b (see FIGS. 2a, 2b)—comprising door-side hinge sub-assembly 306b and tray-side hinge sub-assembly 502b—illustrating a sequence for engaging the door 212 with the tray 222. Although FIGS. 10a-10d depict engagement of hinge assembly 220b only, a similar sequence is understood to be performed for the other hinge assembly 220a to fully engage door 212 with the tray 222.

Figure 10A:
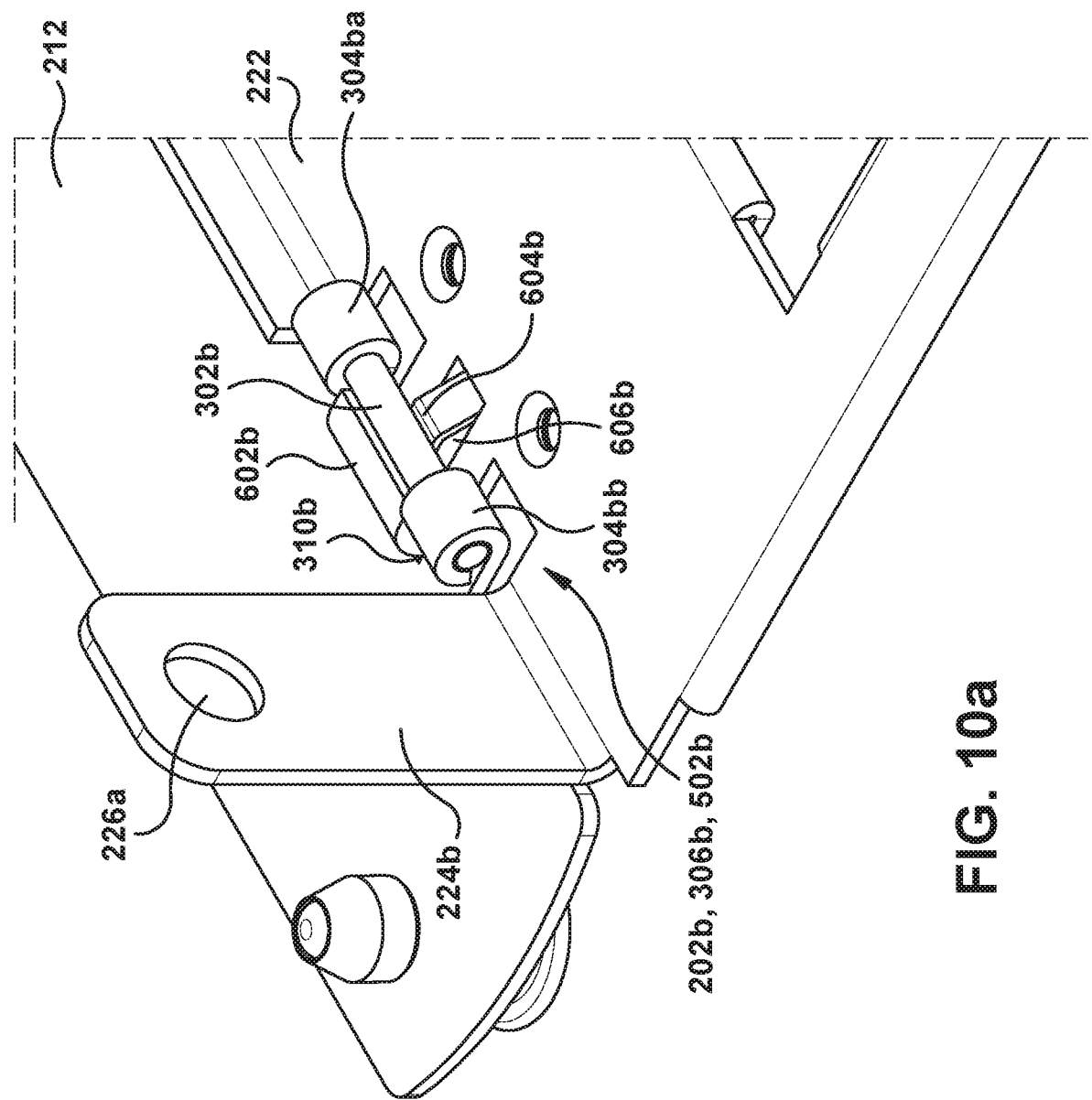
FIG. 10a is a close-up view of a hinge assembly illustrating a first step of a sequence for engaging a door a cable management tray.

Initially, as shown in FIG. 10a, the door 212 is positioned such that dowel pin 302b is maneuvered over the hinge sleeve 602b and rests on top of the engagement tab 604b of locking spring 702b mounted to the bottom surface of tray 222. The gap 310b between the two dowel sleeves 304a and 304b (see FIG. 4) of door-side hinge sub-assembly 306b is sized to allow the hinge sleeve 602b of the tray-side hinge sub-assembly 502b to reside within the gap 310 (see also FIG. 4) during this engagement.

Figure 10B:
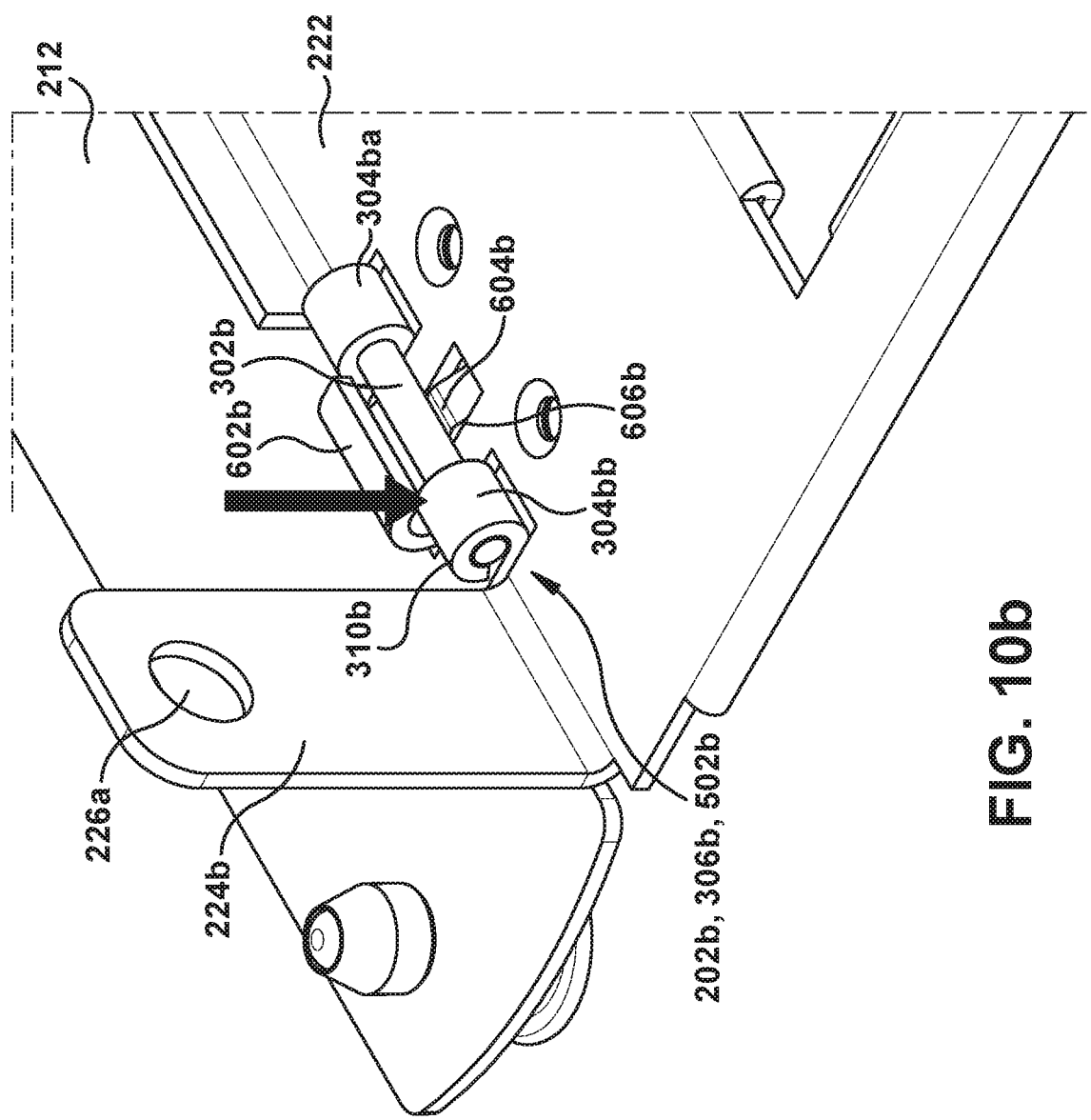
FIG. 10b is a close-up view of the hinge assembly illustrating a second step of the sequence for engaging the door with the cable management tray.

With the dowel pin 302b resting on top of the engagement tab 604b, downward pressure is applied by the dowel pin 302b, as shown in FIG. 10b, causing the engagement tab 604b to be displaced through the rectangular opening 606b (see also FIGS. 6, 7). Returning briefly to FIG. 8 and with reference to the illustration of the locking spring 702, the downward pressure applied to the engagement tab 604 by the dowel pin 302 causes the locking tongue 704 to be displaced downward, acting as a cantilever anchored to the base section 710 of the locking spring 702 at location 712. When the locking tongue 704 is bent in this manner, the bending stresses are distributed along the length of the locking tongue 704, reducing the risk of eventual wear and breakage at a point along the locking tongue 704 that would otherwise sustain a majority of the bending stresses. Since this distribution of bending stress increases as the length of locking tongue 704 increases, some embodiments of the locking spring 702 can be sized to maximize or substantially maximize this length. For example, as shown in FIG. 7, the length of locking spring 702 can be sized such that the base section 710 of the spring resides at or near the rear edge of the tray 222 while the locking spring 702 is mounted to the tray 222. Thus, the length of the locking spring 702 traverses all or nearly all of the available distance between the rectangular opening 606 and the rear of the tray 222.

To further increase the length of locking tongue 704, some embodiments of locking spring 702a can be fabricated such that the locking tongue 704 extends from the base section 710 of the locking spring between the mounting arms 714a and 714 in a non-parallel manner. For example, in the example depicted in FIG. 8, if locking tongue 704 extended between the two mounting arms 714a and 714b substantially parallel to the two mounting arms 714a, 714b, the axis of the locking tongue 704 would lie along dashed line 820. Instead, in the illustrated embodiment, locking spring 702 is fabricated such that the locking tongue 704 traverses from the base section 710 of locking spring 702 to the front of the locking spring 702 diagonally relative to the dashed line 820, such that the actual locking tongue axis—represented by dashed line 822—increasingly deviates from dashed line 820 as a function of distance from the base section 710. This results in an orientation in which the base of the locking tongue 704 (at location 712) is substantially equidistant between the two locking arms 714a and 714b, but the front end of the locking tongue 704 is closer to mounting arm 714b than to mounting arm 714a. This construction can further increase the length of locking tongue 704 while still permitting the locking tongue 704 to fit within the constrained space of the locking spring 702 as a whole and the tray 222. It is to be appreciated that embodiments of the locking spring having a locking tongue 704 that extends substantially parallel to the mounting arms 714a and 714b are also within the scope of one or more embodiments of this disclosure.

Bending stresses can be further distributed by virtue of locating the mounting holes 708a and 708b near the front of the locking spring 702—on mounting brackets 706a and 706b located on the front-facing ends of mounting arms 714a and 714b—while leaving the base section 710 of the locking spring 702 unmounted. This leaves the base section 710 free to be deflected away from the bottom surface of the tray 222, which can further alleviate bending stresses at the base of the locking tongue 704 (at location 712) by distributing some of the bending stress along the two mounting arms 714a and 714b. Locking spring 702 can be made of any suitable material with sufficient elasticity and strength to yield to bending forces and return to its original shape without sustaining gradual structural degradation, including but not limited to cold rolled steel, stainless steel, plastic, or other such material.

Figure 10C:
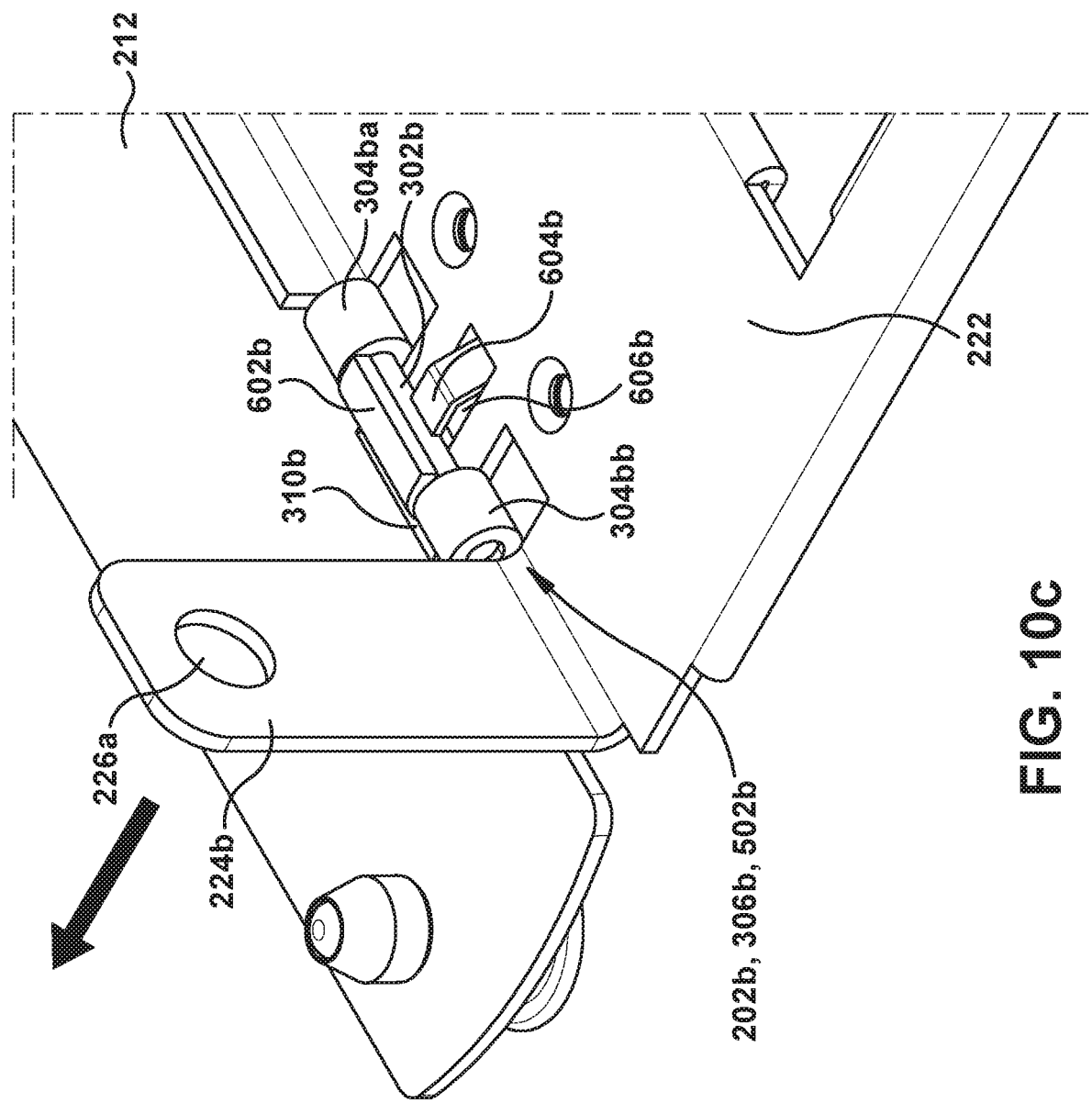
FIG. 10c is a close-up view of the hinge assembly illustrating a third step of the sequence for engaging the door with the cable management tray.

Returning now to FIG. 10b, when downward pressure is applied to the dowel pin 302b and the engagement tab 604b is displaced through the rectangular opening 606b of the tray 222, the dowel pin 302b becomes aligned with the open side of the hinge sleeve 602b. As shown in FIG. 10c, with the dowel pin 302b aligned in this manner, the door 212 can be pulled forward to engage the dowel pin 302b with the hinge sleeve 602b. When fully engaged with the hinge sleeve 602b, the dowel pin 302b is moved clear from the engagement tab 604b, permitting the spring-loaded cantilevered locking tongue 704b of locking spring 702 (see FIG. 8) to return to its resting state. The spring action of the locking tongue 704b causes the engagement tab 604b to again protrude through the rectangular opening 606b, locking the dowel pin 302b in the hinge sleeve 602b. FIG. 10d is a cross-sectional view of the resulting hinge assembly 220b (see FIGS. 2a, 2b) in which the engagement between the dowel pin 302b and the engagement tab 604b can be seen. While in this fully engaged and locked orientation, the leading edge 818b of the engagement tab 604b abuts against the dowel pin 302b, holding the dowel pin 302b in place within the hinge sleeve 602b while permitting the dowel pin 302b to rotate within the hinge sleeve 602b while the door 212 is being opened or closed.

Figure 11A:
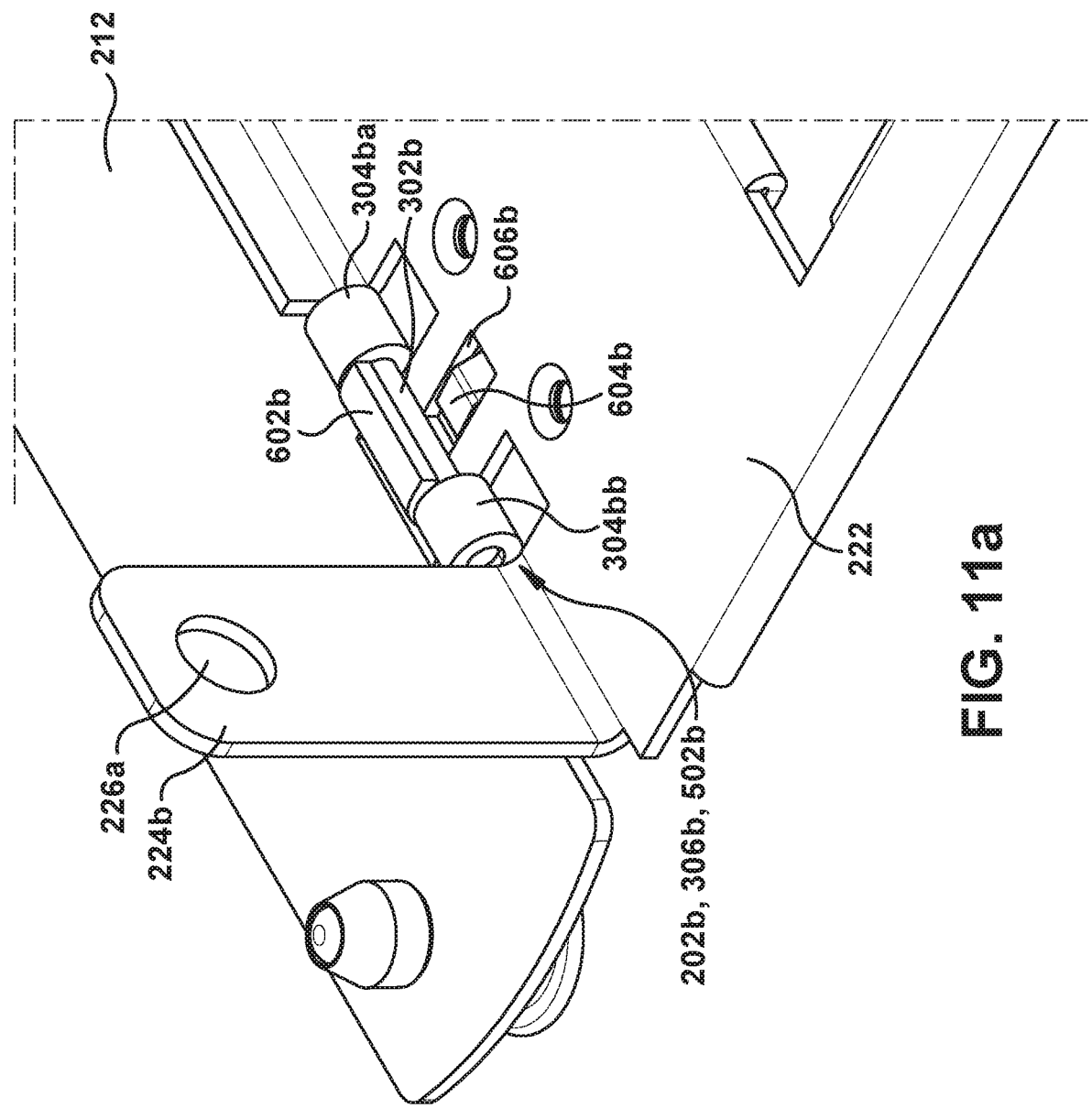
FIG. 11a is a close-up view of a hinge assembly illustrating a first step of a sequence for disengaging a door from its cable management tray.

When both hinge assemblies 220a and 220b (see FIGS. 2a, 2b) are engaged as described above in connection with FIGS. 10a-10d, door 212 is rotatably attached to the cable management tray 222 as illustrated in FIGS. 2a and 2b. Hinge assemblies 220a and 220b are also designed to allow the door 212 to be easily removed from the tray 222 by applying pressure to the engagement tabs 604a and 604b of the two hinge assemblies 220a, 220b. FIGS. 11a-11c are close-up views of hinge assembly 220b illustrating a sequence for disengaging the door 212 from the tray 222. Initially, as shown in FIG. 11a, a user can apply downward pressure on the engagement tab 604b, causing the locking tongue 704b to be deflected and pushing the engagement tab 604b through the rectangular opening 606b. In this position, the engagement tab 604b is no longer abutting against the dowel pin 302b, which can then be removed from the hinge sleeve 602b by pushing the door 212 toward the tray 222, as shown in FIG. 11b. This disengages the dowel pin 302b from the hinge sleeve 602b, allowing the dowel pin 302b to be lifted away from the tray 222, as shown in FIG. 11c. When the dowel pin 302b is lifted clear from the engagement tab 604b, the locking tongue 704b is no longer deflected and the engagement tab 604b returns to its default position through the rectangular opening 606b.

The design of the hinge assemblies 202a and 202b allows the door 212 to be easily attached to or removed from the tray 222 even if visibility to the hinge assemblies 202a, 202b is blocked or limited; e.g., in scenarios in which the cable management device 202 is mounted above eye-level, requiring a user to engage or disengage the door 212 by feel alone. In particular, when attaching the door 212 to the tray 222, the user can easily slot the dowel pins 302a, 302b into their respective hinge sleeves 602a, 602b without visual cues, and the spring-loaded engagement tabs 604a, 604b will automatically lock the dowel pins 302a, 302b in place once the correct orientation is achieved. The user can also easily remove the door 212 without visual cues by locating and depressing the engagement tabs 604a, 604b with his or her fingers and sliding the dowel pins 302a, 302b free from their hinge sleeves 602a, 602b. Embodiments of the cable management device 202 can be mounted and used at substantially any location within or on an enclosure or on a rack in which cable management would be beneficial, including front or rear sides of an enclosure or rack.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

What has been described above includes examples of systems and methods illustrative of the disclosed subject matter. It is, of course, not possible to describe every combination of components or methodologies here. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A cable management device, comprising:
    a cable management tray configured to hold a wiring bundle; and
    a door configured to attach to a front edge of the cable management tray via a hinge assembly; and
    a locking spring mounted to a surface of the cable management tray,
    wherein the hinge assembly permits the door to rotate about the hinge assembly and to be disengaged from the cable management tray by depressing an engagement tab formed on the locking spring.

2. The cable management device of claim 1, wherein the hinge assembly comprises:
    a hinge sleeve formed on the front edge of the cable management tray, and
    a dowel pin attached to an edge of the door.

3. The cable management device of claim 2, wherein the locking spring is mounted to a bottom surface of the cable management tray, and the engagement tab protrudes through an opening through the cable management tray and holds the dowel pin within the hinge sleeve while the locking spring is not depressed.

4. The cable management device of claim 3, wherein depressing the engagement tab causes the engagement tab to retract into the opening through the cable management tray and permits the dowel pin to be removed from the hinge sleeve.

5. The cable management device of claim 3, wherein
    the locking spring comprises a flat base section, two substantially parallel mounting arms that extend from the base section, and a cantilevered locking tongue that extends from the base section between the mounting arms, and
    the engagement tab is formed on an end of the cantilevered locking tongue and comprises a raised portion of the cantilevered locking tongue that protrudes through the opening through the cable management tray.

6. The cable management device of claim 5, wherein mounting brackets are formed on ends of the mounting arms.

7. The cable management device of claim 5, wherein a rear edge of the base section is adjacent to a rear edge of the cable management tray.

8. The cable management device of claim 5, wherein the cantilevered locking tongue extends from the base section and extends substantially parallel to the mounting arms.

9. The cable management device of claim 5, wherein the cantilevered locking tongue extends from the base section and extends in a non-parallel manner relative to the mounting arms.

10. The cable management device of claim 1, wherein
    the door comprises a first latching mechanism and a second latching mechanism,
    a first upright bracket is formed at a first end of the cable management tray,
    a second upright bracket is formed at a second end of the cable management tray,
    a first hole and a second hole are formed through the first upright bracket and the second upright bracket, respectively, and
    the first hole and the second hole are configured to receive and hold the first latching mechanism and the second latching mechanism, respectively, while the door is in a closed position.

11. The cable management device of claim 10, wherein the first latching mechanism or the second latching mechanism is at least one of a plunger-type latch, a screw, or a clip.

12. The cable management device of claim 1, wherein
    the door comprises a first magnetic latch and a second magnetic latch,
    a first upright bracket is formed at a first end of the cable management tray,
    a second upright bracket is formed at a second end of the cable management tray,
    a first bracket-mounted magnet and a second bracket-mounted magnet are disposed on the first upright bracket and the second upright bracket, respectively, and
    the first bracket-mounted magnet and the second bracket-mounted magnet are configured to magnetically latch to the first magnetic latch and the second magnetic latch, respectively, while the door is in a closed position.

13. The cable management device of claim 1, wherein the cable management tray comprises one or more loops configured to hold the wiring bundle.

14. A system for managing cable bundles, comprising:
    a cable management tray comprising one or more cable management loops configured to hold a cable bundle, wherein
    a front edge of the cable management tray comprises a tray-side hinge sub-assembly configured to engage with a corresponding door-side hinge sub-assembly on a door,
    the door is permitted to rotate about the tray-side hinge sub-assembly while the tray-side hinge sub-assembly is engaged with the door-side hinge sub-assembly, and
    the door-side hinge sub-assembly is capable of disengagement from the tray-side hinge sub-assembly in response to displacement of an engagement tab formed on a locking spring that is mounted on a surface of the cable management tray.

15. The system of claim 14, wherein the door-side hinge sub-assembly comprises a dowel pin held between two dowel sleeves formed on ends of respective two offset arms that extend from an edge of the door.

16. The system of claim 15, wherein
    the tray-side hinge sub-assembly comprises the engagement tab and a hinge sleeve that extends from the front edge of the cable management tray and terminates in a U-shaped hinge sleeve,
    the U-shaped hinge sleeve is configured to receive the dowel pin while the tray-side hinge sub-assembly is engaged with the door-side hinge sub-assembly, and
    the engagement tab holds the dowel pin in the U-shaped hinge sleeve while the tray-side hinge sub-assembly is engaged with the door-side hinge sub-assembly.

17. The system of claim 14, wherein
locking spring that is mounted on a bottom side of the cable management tray,
the engagement tab is formed on an end of a cantilevered locking tongue of the locking spring, and
the engagement tab protrudes through an opening in the cable management tray.

18. The system of claim 17, wherein
the locking spring comprises a flat base section,
the cantilevered locking tongue extends from the base section between two substantially parallel mounting arms that extend from the base section, and
the engagement tab comprises a raised portion of the cantilevered locking tongue.

19. A cable management system, comprising:
a cable management tray configured to hold a cable harness;
a door attached to the cable management tray via a hinge assembly, wherein the hinge assembly comprises a door-side hinge sub-assembly on the door and a tray-side hinge sub-assembly on the cable management tray; and
a spring-loaded engagement tab formed on a locking spring that is mounted to a surface of the cable management tray,
wherein
the spring-loaded engagement tab holds the door-side hinge sub-assembly in place within the tray-side hinge sub-assembly, and
the door is detachable from the cable management tray in response to depressing the spring-loaded engagement tab.

20. The cable management system of claim 19, wherein
the door-side hinge sub-assembly comprises a dowel pin held between two dowel sleeves formed on ends of respective two offset arms that extend from an edge of the door,
the tray-side hinge sub-assembly comprises the engagement tab and a hinge sleeve that extends from the front edge of the cable management tray and terminates in a U-shaped hinge sleeve,
the U-shaped hinge sleeve is configured to receive the dowel pin while the tray-side hinge sub-assembly is engaged with the door-side hinge sub-assembly, and
the engagement tab holds the dowel pin in the U-shaped hinge sleeve while the tray-side hinge sub-assembly is engaged with the door-side hinge sub-assembly.

\* \* \* \* \*